US009595417B2

(12) United States Patent
Frosien

(10) Patent No.: US 9,595,417 B2
(45) Date of Patent: Mar. 14, 2017

(54) HIGH RESOLUTION CHARGED PARTICLE BEAM DEVICE AND METHOD OF OPERATING THE SAME

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT INTEGRATED CIRCUIT TESTING GESELLSCHAFT FÜR HALBLEITERPRÜFTECHNIK MBH, Heimstetten (DE)

( * ) Notice: Subject to any disclaimer, the term of this patent is extended or adjusted under 35 U.S.C. 154(b) by 0 days.

(21) Appl. No.: 14/579,403

(22) Filed: Dec. 22, 2014

(65) Prior Publication Data
US 2016/0181057 A1 Jun. 23, 2016

(51) Int. Cl.
H01J 37/153 (2006.01)

(52) U.S. Cl.
CPC ..... H01J 37/153 (2013.01); H01J 2237/1534 (2013.01)

(58) Field of Classification Search
None
See application file for complete search history.

(56) References Cited

U.S. PATENT DOCUMENTS

| 3,080,500 | A | * | 3/1963 | Preston | H01J 29/52 313/423 |
| 5,319,207 | A | * | 6/1994 | Rose | H01J 37/153 250/396 R |
| 5,449,914 | A | * | 9/1995 | Rose | H01J 37/05 250/305 |
| 7,348,566 | B2 | * | 3/2008 | Tromp | H01J 37/05 250/305 |
| 7,381,949 | B2 | * | 6/2008 | Mauck | G01N 23/04 250/298 |
| 7,432,514 | B2 | * | 10/2008 | Tromp | B82Y 10/00 250/492.22 |

(Continued)

OTHER PUBLICATIONS

Mauck, "Correction of Chromatic Aberration with an Electron Mirror", Portland State University PDXScholar, 1993.*

Primary Examiner — Michael Logie
(74) Attorney, Agent, or Firm — Kilpatrick Townsend & Stockton LLP

(57) ABSTRACT

A charged particle beam device is provided which includes a primary beam source device adapted for generating a primary charged particle beam, a mirror corrector device adapted for providing compensation of spherical and/or chromatic aberrations, a first beam separator adapted for transmitting the primary charged particle beam to the mirror corrector device and for separating the primary charged particle beam from a compensating primary charged particle beam reflected by the mirror corrector device, wherein the first beam separator has a magnetic deflector configured to generate at least one dipole magnetic field, an objective lens adapted for focusing the compensating primary charged particle beam onto a specimen, and a second beam separator adapted for transmitting the compensating primary charged particle beam to the specimen and for separating the compensating primary charged particle beam from a secondary charged particle beam originating from the specimen.

16 Claims, 7 Drawing Sheets

(56) References Cited

U.S. PATENT DOCUMENTS

| | | | | |
|---|---|---|---|---|
| 7,453,062 B2* | 11/2008 | Tromp | ............... | H01J 37/05 250/305 |
| 8,183,526 B1* | 5/2012 | Mankos | ............. | H01J 37/05 250/305 |
| 8,258,474 B1* | 9/2012 | Mankos | ............. | H01J 37/04 250/306 |
| 8,334,508 B1* | 12/2012 | Mankos | ............. | H01J 37/05 250/305 |
| 8,373,137 B2* | 2/2013 | Krivanek | ............ | H01J 37/05 250/396 ML |
| 8,729,466 B1* | 5/2014 | Mankos | ........... | H01J 37/026 250/305 |
| 2004/0036031 A1* | 2/2004 | Rose | ............... | H01J 37/153 250/396 R |
| 2004/0075053 A1* | 4/2004 | Preikszas | ......... | H01J 37/147 250/310 |
| 2006/0289793 A1* | 12/2006 | Mauck | .............. | G01N 23/04 250/491.1 |
| 2007/0069127 A1* | 3/2007 | Okuda | .............. | H01J 37/21 250/310 |
| 2007/0200070 A1* | 8/2007 | Tromp | .............. | H01J 37/05 250/396 R |
| 2009/0321634 A1* | 12/2009 | Khursheed | ......... | H01J 37/05 250/307 |
| 2010/0065753 A1* | 3/2010 | Enyama | ........ | H01J 37/1472 250/397 |
| 2010/0200748 A1* | 8/2010 | Adamec | ........... | H01J 37/244 250/307 |

* cited by examiner

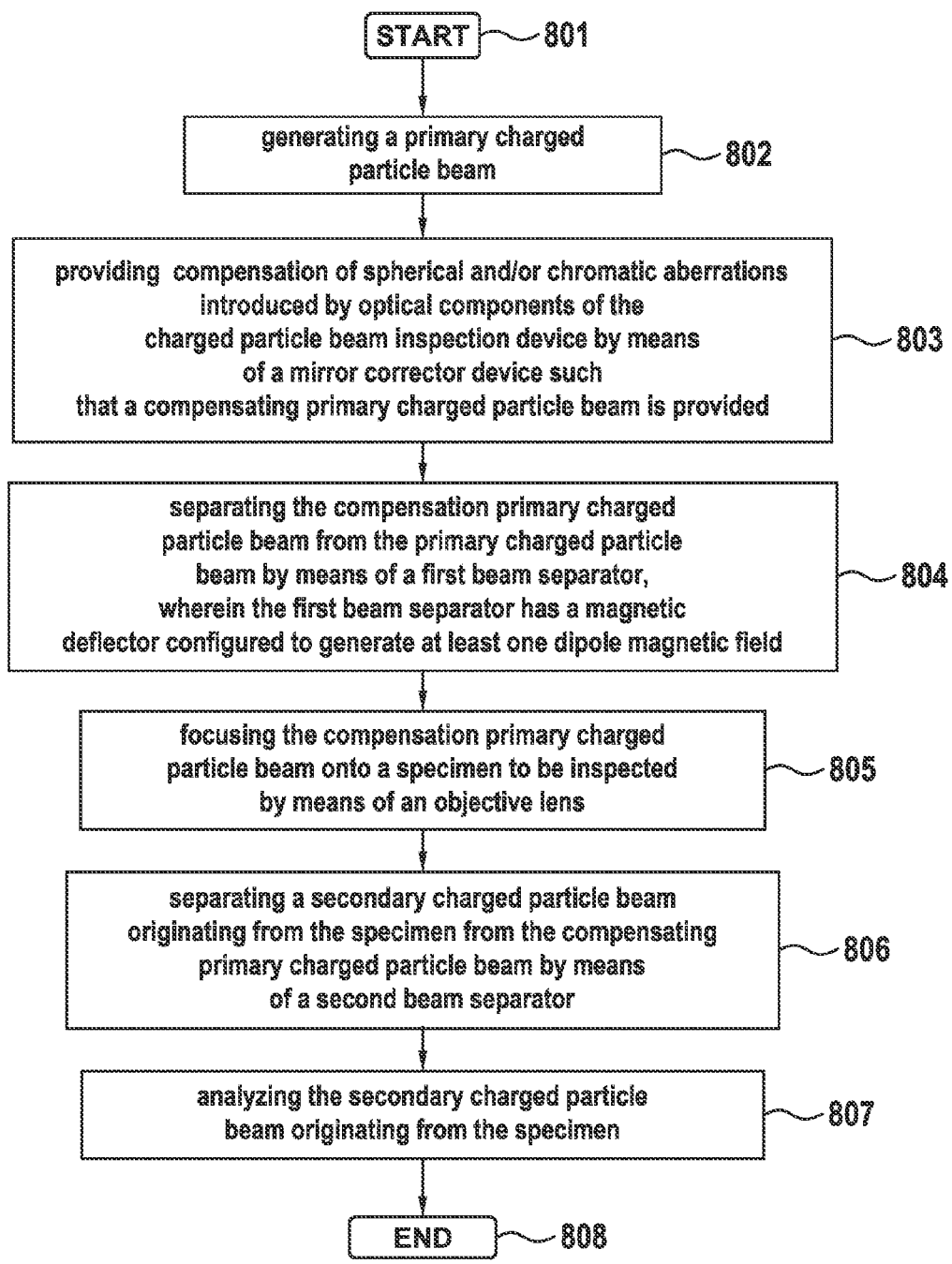

HIGH RESOLUTION CHARGED PARTICLE BEAM DEVICE AND METHOD OF OPERATING THE SAME

FIELD

Embodiments of the present application relate to charged particle beam devices adapted, e.g. for testing system applications, lithography system applications, integrated circuit testing, defect review, critical dimension measurement, electron beam inspection, surface imaging (SEM) or the like. Embodiments of the present application also relate to methods of operating a charged particle beam device. Further, embodiments of the present application relate to applications using a high brightness electron gun, e.g. for defect review applications, critical dimension measurement applications and applications for electron beam inspection (EBI).

BACKGROUND

Semiconductor technologies have created a high demand for structuring and probing specimens in the nanometer or even in the sub-nanometer scale. Micrometer and nanometer scale process control, inspection or structuring, is often done with charged particle beams, e.g. electron beams, which are generated and focused in charged particle beam devices, such as electron microscopes or electron beam pattern generators. For inspection purposes, charged particle beams offer superior spatial resolution compared to, e.g. photon beams because their wavelengths are shorter than the wavelengths of light beams.

Inspection devices using charged particle beams such as scanning electron microscopes (SEM) have many functions in a plurality of industrial fields, including, but not limited to, inspection of electronic circuits during manufacturing, exposure systems for lithography, detecting devices, defect inspection tools, and testing systems for integrated circuits. In such particle beam systems fine probes with high current density can be used. For instance in case of an SEM, the primary electron (PE) beam generates particles like secondary electrons (SE) and/or backscattered electrons (BSE) that can be used to image and analyze a specimen.

Many instruments use magnetic, electrostatic or compound electrostatic-magnetic objective lenses to focus the primary beam onto the specimen. In some cases, the electrical field of the objective lens simultaneously collects the generated particles (SE and BSE), which are entering into the lens, and are guided onto a detector. For uniform and high efficiency electron collection and detection the secondary and/or backscattered particles are beneficially separated from the primary beam. With decreasing feature size in semiconductor device technology there is a need for increasing spatial resolution into the sub-nanometer range at low landing energies. In particular low landing energies below 1 keV are required to reduce scattering inside the sample which may limit spatial resolution.

For high resolution imaging devices based on electron optics systems reduced aberrations and/or an improved aberration correction is one aspect to be considered. The provision of charged particle beam devices having aberration correction is beneficial.

Prior art SEM columns are limited in their achievable resolution due to the diffraction limit, chromatic and/or spherical aberrations of the objective lens and/or other optical components included in the SEM column. In particular at low landing energies of 5 keV or below, in particular 500 eV or below, chromatic aberration is the limitation. This aspect can be addressed by providing a monochromator device adapted for reducing an energy width of the charged particle beam. Due to an enlargement of the aperture angle, however, spherical aberration prevents a significant improvement of resolution.

SUMMARY

According to one embodiment, a charged particle beam device is provided which includes a primary beam source device adapted for generating a primary charged particle beam, a mirror corrector device adapted for providing compensation of spherical and/or chromatic aberrations, a first beam separator adapted for transmitting the primary charged particle beam to the mirror corrector device and for separating the primary charged particle beam from a compensating primary charged particle beam reflected by the mirror corrector device, wherein the first beam separator has at least a magnetic deflector configured to generate at least one dipole magnetic field, an objective lens adapted for focusing the compensating primary charged particle beam onto a specimen, and a second beam separator adapted for directing the compensating primary charged particle beam to the objective lens and for separating the compensating primary charged particle beam from a secondary charged particle beam originating from the specimen.

According to another embodiment, a method of operating a charged particle beam device is provided. The method includes generating a primary charged particle beam, providing compensation of spherical and/or chromatic aberrations introduced by optical components of the charged particle beam device by means of a mirror corrector device such that a compensating primary charged particle beam is provided, separating the compensating primary charged particle beam from the primary charged particle beam by means of a first beam separator, wherein the first beam separator has a magnetic deflector configured to generate at least one dipole magnetic field, focusing the compensating primary charged particle beam onto a specimen to be inspected by means of an objective lens, separating a secondary charged particle beam originating from the specimen from the compensating primary charged particle beam by means of a second beam separator, and analyzing the secondary charged particle beam originating from the specimen.

Further features and details are described in the dependent claims, the description and the drawings.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIG. 4 is a flowchart illustrating a method of operating a charged particle beam source device.

Figure 1:
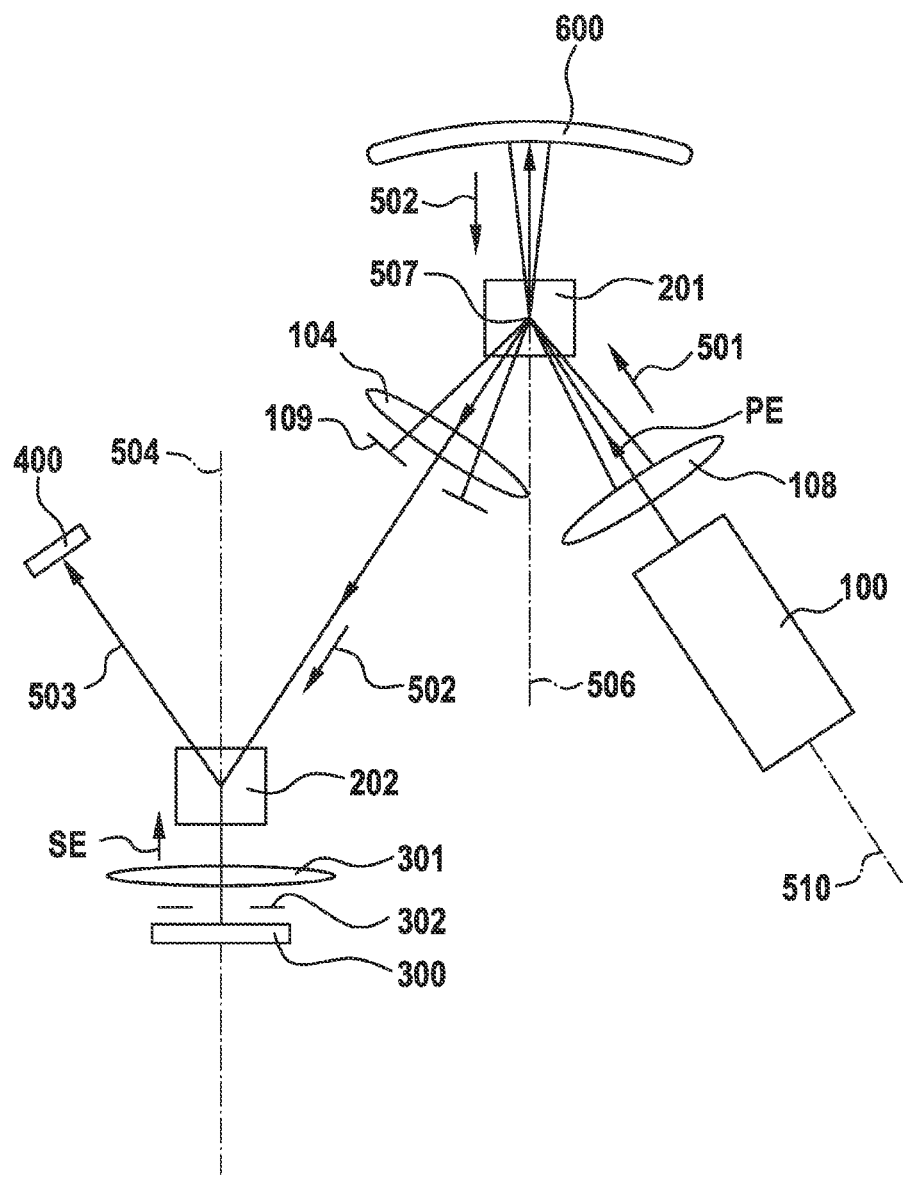
FIG. 1 shows schematically a charged particle beam device according to an embodiment.

It is contemplated that elements of one embodiment may be advantageously utilized in other embodiments without further recitation.

DETAILED DESCRIPTION OF THE DRAWINGS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

In the following a charged particle beam device according to some embodiments or components thereof will described. Embodiments described herein relate to a charged particle beam device which includes a primary beam source device adapted for generating a primary charged particle beam, a mirror corrector device adapted for providing compensation of spherical and/or chromatic aberrations, a first beam separator adapted for transmitting the primary charged particle beam to the mirror corrector device and for separating the primary charged particle beam from a compensating primary charged particle beam reflected by the mirror corrector device, an objective lens adapted for focusing the compensating primary charged particle beam onto a specimen, and a second beam separator adapted for transmitting the compensating primary charged particle beam to the specimen and for separating the compensating primary charged particle beam from a secondary charged particle beam originating from the specimen. The first beam separator has at least a magnetic deflector configured to generate at least one dipole magnetic field.

According to a typical embodiment which can be combined with other embodiments described herein, at least one condenser lens can be provided between the first beam separator and the second beam separator. In this way, a flexible and easy to set-up beam inspection device can be designed.

According to a typical embodiment which can be combined with other embodiments described herein, a transfer lens can be provided which is adapted for focusing the primary charged particle beam emitted from the primary beam source device into the center of the first beam separator.

As described herein, some discussions and descriptions relating to the generation of a charged particle beam are exemplarily described with respect to electrons in electron microscopes. However, other types of charged particles, e.g. positive ions, could be provided by the device in a variety of different instruments. According to embodiments described herein, which can be combined with other embodiments, a charged particle beam is referred to as an electron beam.

A "specimen" as referred to herein, includes, but is not limited to, semiconductor wafers, masks, semiconductor workpieces, and other workpieces such as memory disks and the like. Embodiments can be applied to any workpiece which is inspected or imaged, on which material is deposited or which is structured. A specimen includes a surface to be structured or on which layers are deposited.

The term "aberration" as used in this specification intends to describe an enlargement of lens foci or probe in a charged particle beam. Aberrations can include spherical aberrations, chromatic aberrations, or both spherical and chromatic aberrations in a charged particle beam propagation path.

According to some embodiments, which can be combined with other embodiments described herein, the apparatus and methods can be configured for or are applied for electron beam inspection, for critical dimensioning measurement applications and defect review applications. Generally, when referring to a "beam current", it is understood that the beam of charged particles carries a predetermined charge. The charged particle beam device can be in particular used for high speed scanning and detection, for example for electron beam inspection system (EBI) where a high probe current is required.

Furthermore, embodiments described herein relate to a method of operating a charged particle beam device. The method includes generating a primary charged particle beam, providing compensation of spherical and/or chromatic aberrations introduced by optical components of the charged particle beam device by means of a mirror corrector device such that a compensating primary charged particle beam is provided, separating the compensating primary charged particle beam from the primary charged particle beam by means of a first beam separator, wherein the first beam separator has at least a magnetic deflector configured to generate at least one dipole magnetic field, focusing the compensating primary charged particle beam onto a specimen to be inspected by means of an objective lens, separating a secondary charged particle beam originating from the specimen from the compensating primary charged particle beam by means of a second beam separator, and analyzing the secondary charged particle beam originating from the specimen.

The term "compensating primary charged particle beam" as used in this specification intends to describe a primary charged particle beam which can compensate, at least partially, spherical and/or chromatic aberrations introduced by optical components of the charged particle beam device or of a charged particle beam propagation path. The term "compensating primary charged particle beam" as used in this specification is not to be understood as a charged particle beam which must fully compensate aberrations, rather some aberrations may still be present in the primary charged particle beam incident onto a specimen.

FIG. 1 shows schematically a charged particle beam device according to an embodiment. Reference numeral 100 denotes a primary beam source device. The primary beam source device 100 can be designed as a high brightness, low energy width beam source selected from the group consisting of a thermal field emitter TFE source, a cold field emitter CFE source, or carbon nanotube source. By operating the primary charged particle source, a primary charged particle beam 501, e.g. a beam of primary electrons PE can be emitted and directed towards a first beam separator 201, in an emission direction, e.g. along optical axis 510. Thereby, a center line along the optical axis 510 of the primary electron beam PE intersects the center of the first beam separator 201.

In the first beam separator 201 the primary charged particle beam is deflected in a direction of the mirror axis 506 which approximately coincides with a central axis of a mirror corrector device 600. According to embodiments which can be combined with other embodiments described herein, the first beam separator 201 has at least a magnetic deflector configured to generate at least one dipole magnetic field. Furthermore, the first beam separator 201 can be selected from the group consisting of a magnetic deflection beam separator, a combined crossed electrostatic-magnetic field beam separator, a combination of two, three or four magnetic deflectors (so-called 2B, 3B, or 4B deflectors), a combination of a magnetic and an electrostatic deflector, e.g. a Wien filter, and a dispersion free combined magnetic-electrostatic deflection unit, a device based on a combine crossed electrostatic-magnetic deflection field, i.e. as a combined crossed electrostatic-magnetic deflection beam separator, and any combinations thereof.

According to embodiments which can be combined with other embodiments described herein, a transfer lens 108 can be arranged between the primary beam source device 100 and the first beam separator 201. The transfer lens 108 is adapted for focusing the primary charged particle beam 501 emitted from the primary beam source device 100 into the center of the first beam separator 201. By focusing the primary charged particle beam 501 into the center of the first beam separator 201, a cross-over focal point 507 can be positioned in the center of the first beam separator 201. Thereby, by arranging the cross-over in this way, the first beam separator 201 introduces no or at least only a very small amount of aberrations.

The first beam separator 201 deflects the primary charged particle beam 501 in a direction of a mirror axis 506 of the mirror corrector device 600 e.g., by means of a magnetic deflector configured to generate at least one magnetic dipole field. As the cross-over focal point 507 is located in the center of the first beam separator 201, this cross-over can be used as a focus on which a correcting action of the mirror corrector device 600 is based. In other words, the mirror corrector device 600 is adapted for correcting spherical and/or chromatic aberrations of a charged particle beam propagation path between the first beam separator 201 and a specimen 300 to be investigated. This beam propagation path can include, but is not restricted to, at least one condenser lens 104, a second beam separator 202, an objective lens 301 and a control electrode 302, as shown in FIG. 1. In this way, the mirror corrector device 600 can be adjusted for compensating spherical and/or chromatic aberrations of at least one of the objective lens 301 and the at least one condenser lens 104. The second beam separator 202 can be provided as a simple deflection element having at least one magnetic dipole deflection field. The at least one dipole magnetic field can be generated by a magnetic deflector provided in the second beam separator 202.

According to embodiments which can be combined with other embodiments described herein, an exit aperture 109 for the condenser lens 104 can be provided. The exit aperture 109 can be arranged in an optical path between the first beam separator 201 and the second beam separator 202 and can be designed such that an opening angle of the compensating primary charged particle beam 502 towards the second beam separator 202 can be defined. Thereby, a beam propagation path between the first beam separator 201 and the second beam separator 202 can be flexibly adjusted in a simple manner.

According to further embodiments which can be combined with other embodiments described herein, the second beam separator 202 can be selected from the group consisting of a magnetic deflection beam separator, a combined crossed electrostatic-magnetic field beam separator, a combination of two, three or four magnetic deflectors, a combination of a magnetic and an electrostatic deflector, a Wien filter, a dispersion free combined magnetic-electrostatic deflection unit, and any combinations thereof.

Figure 2:
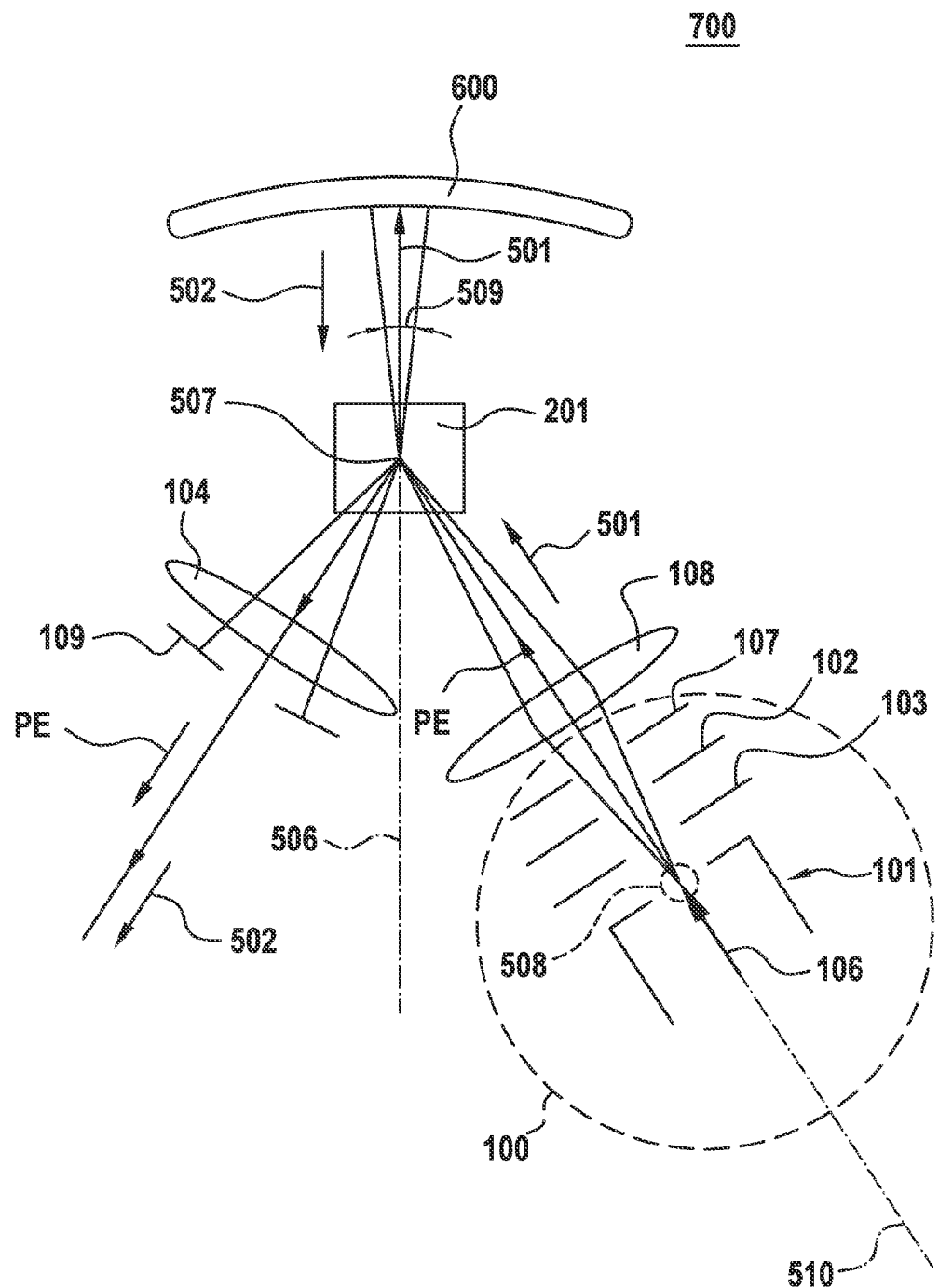
FIG. 2 is a detailed view of an aberration-compensating beam source device, according to an embodiment.

FIG. 2 is a detailed view of an aberration-compensating beam source device 700, according to an embodiment. As shown in FIG. 2, the aberration-compensating beam source device 700 includes the primary beam source device 100, the mirror corrector device 600, and optical components provided in the charged particle beam propagation path of the aberration-compensating beam source device 700. The primary beam source device 100 can include an electron gun 101 having a cathode 106, an anode 102, and an extractor electrode 103 arranged between the anode 102 and the cathode 106. For scanning electron microscopy SEM, the aberration-compensating beam source device 700 is adapted for emitting a beam of primary electrons PE as the compensating primary charged particle beam 502, towards the remainder of an SEM column. In this way, the arrangement shown in FIG. 2 can be regarded as an aberration compensating SEM beam source, i.e. a conventional SEM source in a conventional SEM device can be replaced by the "beam separator—correction mirror—transfer lens—electron gun" arrangement shown in FIG. 2.

Figure 3A:
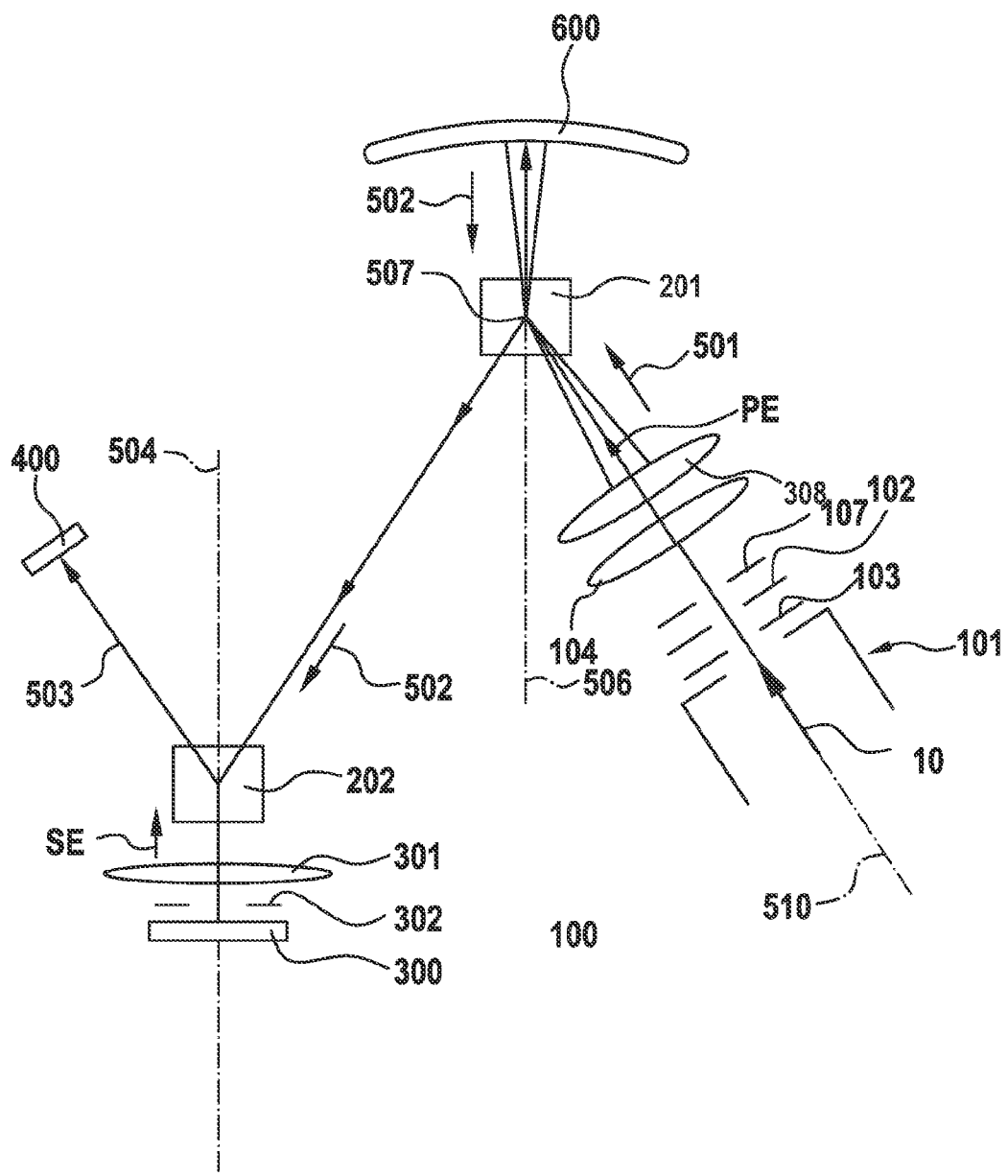
FIG. 3A to 3D are schematic illustrations of charged particle beam devices according to another embodiment.
Figure 3B:
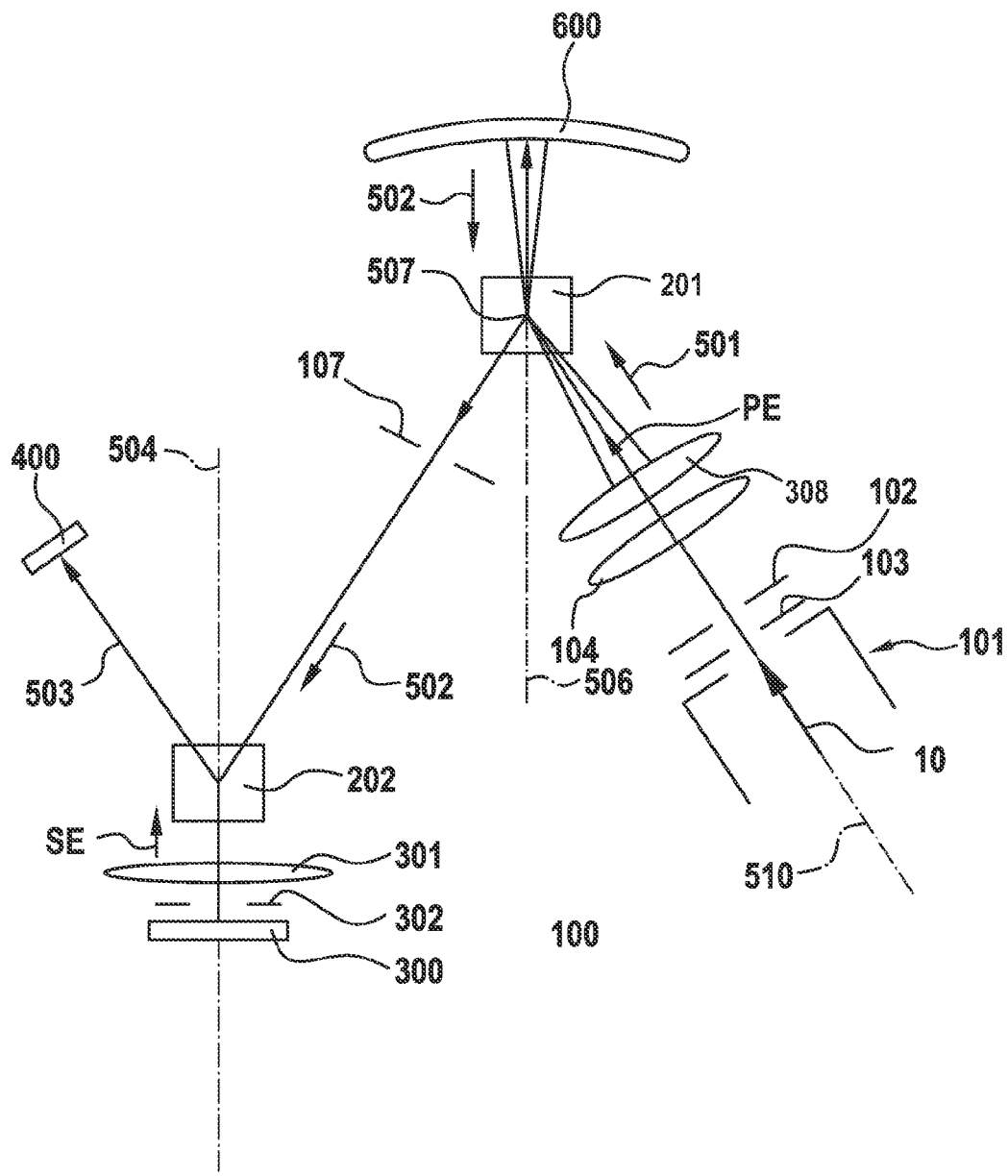
Figure 3C:
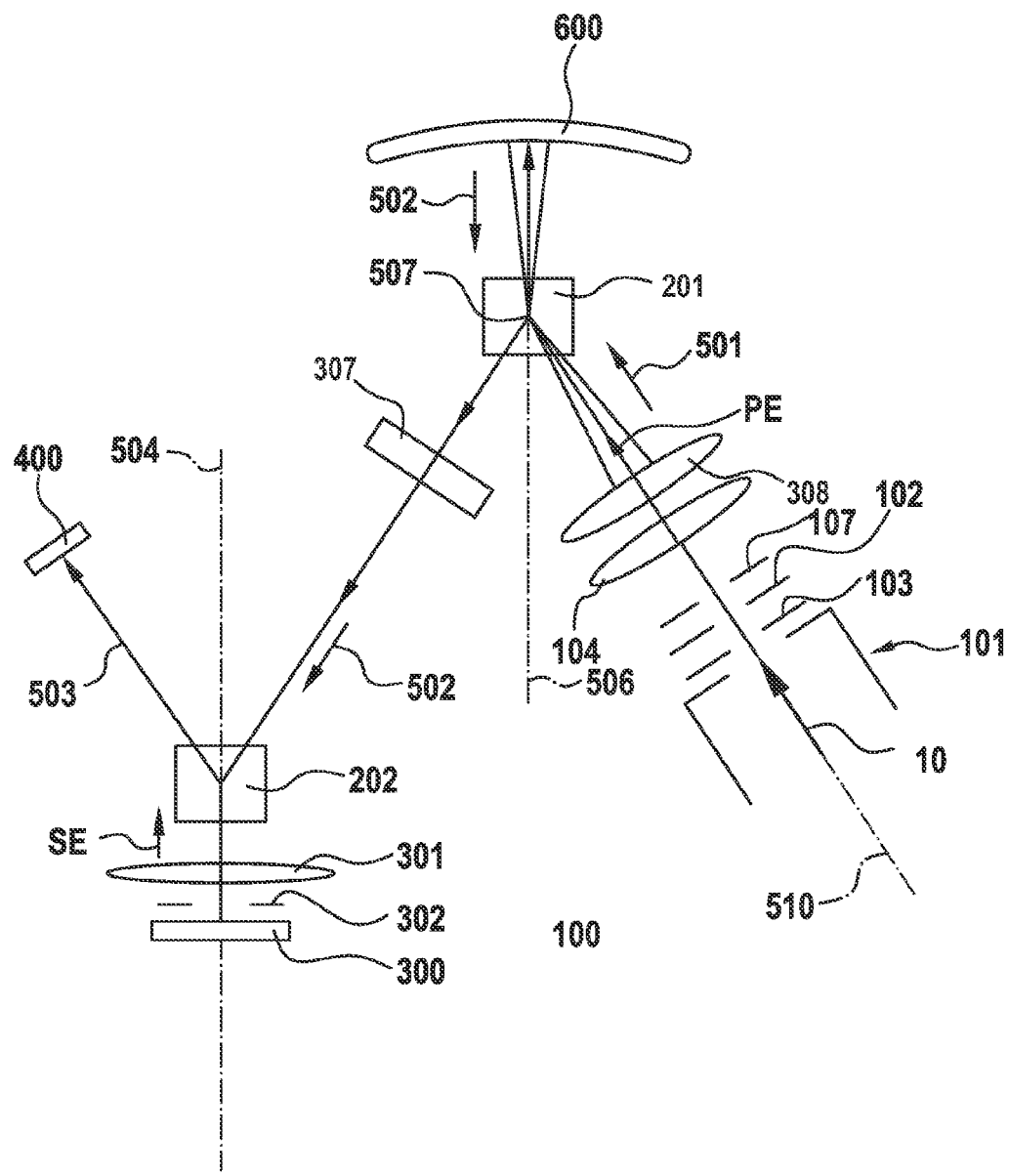

As e.g. shown in FIGS. 3A, 3B and 3C, according to yet further embodiments which can be combined with other embodiments described herein, the condenser lens system including condenser lens 104 and condenser lens 308 can be arranged between the source 100 and the first bean separator 201. The condenser lens system having two condenser lenses is configured to determine the source size, the aperture angle, and the location of the cross over. Particularly, the location of the cross over in the first beam separator 201 can be provided by a condenser lens system having two or more condenser lenses.

FIG. 3A shows an embodiment, wherein a primary charged particle beam 501 is generated by the primary beam source device, e.g. including the electron gun 101. An aperture 107, for example a beam limiting aperture, can be arranged in an optical path between primary beam source device 100 and the first beam separator 201. The aperture 107 can be used for adjusting an opening angle of the primary charged particle beam 501 incident onto the first beam separator 201. Furthermore, the aperture 107 can be used for controlling an opening angle of a charged particle beam entering the mirror optics. According to typical embodiments, the aperture 107 may also be provided to determine the system aperture or the aperture of the optical system, i.e. to define the charged particles, which are used to contribute to formation of the probe on the specimen.

According to some embodiments, the aperture 107 can be a single aperture, i.e. an aperture with one aperture opening. The aperture may be fixed with respect to the optical axis or which may be movable with respect to the optical axis, for example for alignment purposes. According to yet further embodiments, the aperture 107 can be a multi-aperture, wherein 2 or more aperture openings are provided in the aperture. For example, the aperture openings can have different sizes such that the current passing through the aperture can be varied, particularly when the aperture 107 is the beam limiting aperture. In this case deflectors in front and behind the multi-aperture arrangement are required (not shown) for addressing the individual apertures and which bring the electron beam back to the optical axis 510.

FIG. 3B shows an embodiment, which is similar or comparable to the embodiments described with respect to FIG. 3A. In FIG. 3B the aperture 107 is provided between the first beam separator 201 and the second beam separator 202. As described above, the aperture 107 shown in FIG. 3B can either be a single aperture or a multi-aperture. Further, the aperture 107 can be movable or fixed.

According to another embodiment which can be combined with other embodiments described herein, dispersion correction can be provided by another crossed electrostatic-magnetic field element 307 illustrated in FIG. 3C. Dispersion can be compensated by element 307 as combined electrostatic magnetic deflectors. Additional beam alignment optics for primary and secondary charged particle beams can be provided without adverse effects on optical performance and complexity of optical arrangement.

According to embodiments which can be combined with other embodiments described herein, the mirror corrector device 600 can include a number of individual mirror electrodes, the number being 3, typically 4, and in particular 5 or more. In this way flexibility for a compensation of an aberration coefficient range for spherical aberration, for chromatic aberration, or for both spherical and chromatic aberration can be improved.

A larger number of electrodes provide more flexibility for compensation of the aberration coefficient range for spherical aberration, for chromatic aberration, or for both spherical and chromatic aberration. It also allows controlling the mirror parameters (e.g. focus position and spherical and chromatic aberration coefficients) mostly independently.

The primary charged particle beam 501, which is deflected into the direction of the mirror axis 506 of the mirror corrector device 600, is reflected back by the mirror corrector device 600, and in this way, focused into the cross-over focal point 507 of the first beam separator 201, as a compensating primary charged particle beam 502. Then, the compensating primary charged particle beam 502 is deflected towards the second beam separator 202 which in turn can deflect the compensating primary charged particle beam 502 in a direction of an axis of incidence 504 onto a specimen 300 to be investigated.

According to embodiments which can be combined with other embodiments described herein, the at least one condenser lens 104 or the condenser lens system, respectively, can be arranged between the first beam separator 201 and the second beam separator 202 or between the primary beam source device 100 and the first bean separator 201, as e.g. shown in FIGS. 3A, 3B and 3C. Thus, the condenser optics can include a combination of the transfer lens 108 or transfer lens system, respectively, and the condenser lens 104 or condenser lens system, respectively. The condenser optics can include, but is not limited to, a lens system including at least two individual lenses. The condenser optics can be adapted for directing the compensating primary charged particle beam 502 towards the second beam separator 202 and then, using the objective lens 301, onto the specimen 300 to be investigated. The control electrode 302 can be arranged within the charged particle beam propagation path, between the objective lens 301 and the specimen 300. The control electrode 302 can be adapted for adjusting, inter alia, the electrical field strength at the specimen 300 and hence the extraction of secondary particles from the surface. The landing energy at which the charged particles of the compensating primary charged particle beam 502 impinge on the specimen 300 is defined by the voltage difference between the electron gun 101 and the specimen 300.

According to embodiments which can be combined with other embodiments described herein, charged particles of the primary charged particle beam 501 and/or of the compensating primary charged particle beam 502 propagating between the primary beam source device 100 and the objective lens 301 in a charged particle beam column are provided with a high beam boost energy of at least 8 keV, typically at least 15 keV, and in particular with an energy of at least 30 keV.

On the other hand, according to yet further modifications or alternatives, in the objective lens 301 and/or between the objective lens 301 and the specimen 300, the charged particles of the compensating primary charged particle beam 502 are decelerated to a landing energy which amounts to approximately 1 keV or below, and typically amounts to approximately 500 eV or below. Thus, even for high energy beam devices, which have a high energy charged particle beam propagation path and/or which have approximately 10 to 50 times higher beam energy in the column compared to the landing energy, broadening effects and aberrations due to interaction between charged particles such as electron-electron interaction can be reduced. By reducing broadening effects and aberrations, an application of the charged particle beam device according to embodiments described herein as a scanning electron microscope (SEM) can have many functions in a plurality of industrial fields, including, but not limited to, inspection of electronic circuits during manufacturing, exposure systems for lithography, detecting devices, etc.

According to embodiments which can be combined with other embodiments described herein, the objective lens 301 can be provided as a low-aberration, short-focal length lens selected from the group consisting of an electrostatic retarding field lens, and an electrostatic-magnetic compound lens. Fine focusing of the compensating primary charged particle beam 502 on the specimen 300 at low landing energy can be achieved.

According to embodiments which can be combined with other embodiments described herein, aberration compensation can be performed with respect to spherical and/or chromatic aberrations of the objective lens 301 or the objective lens system. In addition to that, or alternatively, aberration compensation can be performed with respect to spherical and/or chromatic aberrations of the condenser lens 104 in cases in which the condenser lens 104 or condenser lens system contributes to an overall system aberration. Aberrations mentioned above can include chromatic aberrations, spherical aberrations, or both.

It is noted here that the transfer lens 108 can be regarded as a part of condenser optics. The transfer lens 108, on the other hand, can be provided as a lens system including at least two individual lenses.

The compensating primary charged particle beam 502 which is reflected by the mirror corrector device 600 and which already contains the aberration compensation information is then used as the primary beam of charged particles for probing a specimen 300. When probing the specimen 300 using the compensating primary charged particle beam 502, for instance in case of an SEM column, the primary electron beam generates particles like secondary electrons SE and/or backscattered electrons that can be used to image and analyze the specimen 300. For analyzing the specimen 300, a secondary charged particle beam 503 originating from the specimen 300 is separated from the compensating primary charged particle beam 502 by means of the second beam separator 202 and is directed towards a charged particle beam detection device 400. Thereby, e.g. in case of scanning electron microscopy SEM, secondary electrons SE emitted from the specimen 300 can pass through the objective lens 301 and can then be detected by the charged particle beam detection device 400.

Thereby, a simple SEM architecture can be provided, in which a corrector device for spherical and chromatic aberration correction is integrated. A mirror corrector device configuration as described herein in various embodiments can provide a robust architecture due to less optical components as compared to multipole correctors. The SEM architecture according to embodiments described herein can provide approximately sub-half nanometer resolution or less, at low landing energies. Furthermore, flexible arrangements for secondary electron SE detection and backscattered electron BSE detection, respectively, can be provided. In addition to that, the SEM architecture according to embodiments provides versatile primary electron beam/secondary electron beam separation and on-axis detection.

According to embodiments which can be combined with other embodiments described herein, the mirror corrector device 600 can include a number of individual electrodes, the number being 3, typically 4, and in particular 5 or more. As discussed herein above with respect to FIG. 1, a larger number of electrodes can offer more flexibility in the compensation of an aberration coefficient range for both spherical and chromatic aberration.

According to embodiments which can be combined with other embodiments described herein, the first beam separator 201 can be provided as a simple deflection element having at least one magnetic dipole deflection field. The at least one dipole magnetic field can be generated by a magnetic deflector provided in the first beam separator 201. Furthermore, or alternatively, the first beam separator 201 can be designed as a magnetic deflection sector field beam separator or a combined crossed electrostatic-magnetic deflection field beam separator. A primary charged particle beam 501 is generated by the primary beam source device 100. An aperture 107 can be arranged in an optical path between primary beam source device 100 and the first beam separator 201. In this way, the source exit aperture 107 can be used for adjusting an opening angle of the primary charged particle beam 501 incident onto the first beam separator 201. Furthermore, the aperture 107 can be used for controlling an opening angle of a charged particle beam entering the mirror optics.

An aperture angle 509 of the primary charged particle beam 501 when directed to the mirror corrector device 600 approximately corresponds to a solid angle provided by the effect of the transfer lens 108 which focuses the primary charged particle beam 501 emitted from the primary beam source device 100 into the center of the first beam separator 201. Moreover, the transfer lens 108 can be adapted for imaging a virtual gun cross-over point 508 of the electron gun 101 into the center of the first beam separator 201. Thereby, the cross-over focal point 507 can be positioned in the center of the first beam separator 201 and thus, aberrations resulting from the first beam separator 201 can be avoided or at least reduced.

Figure 3D:
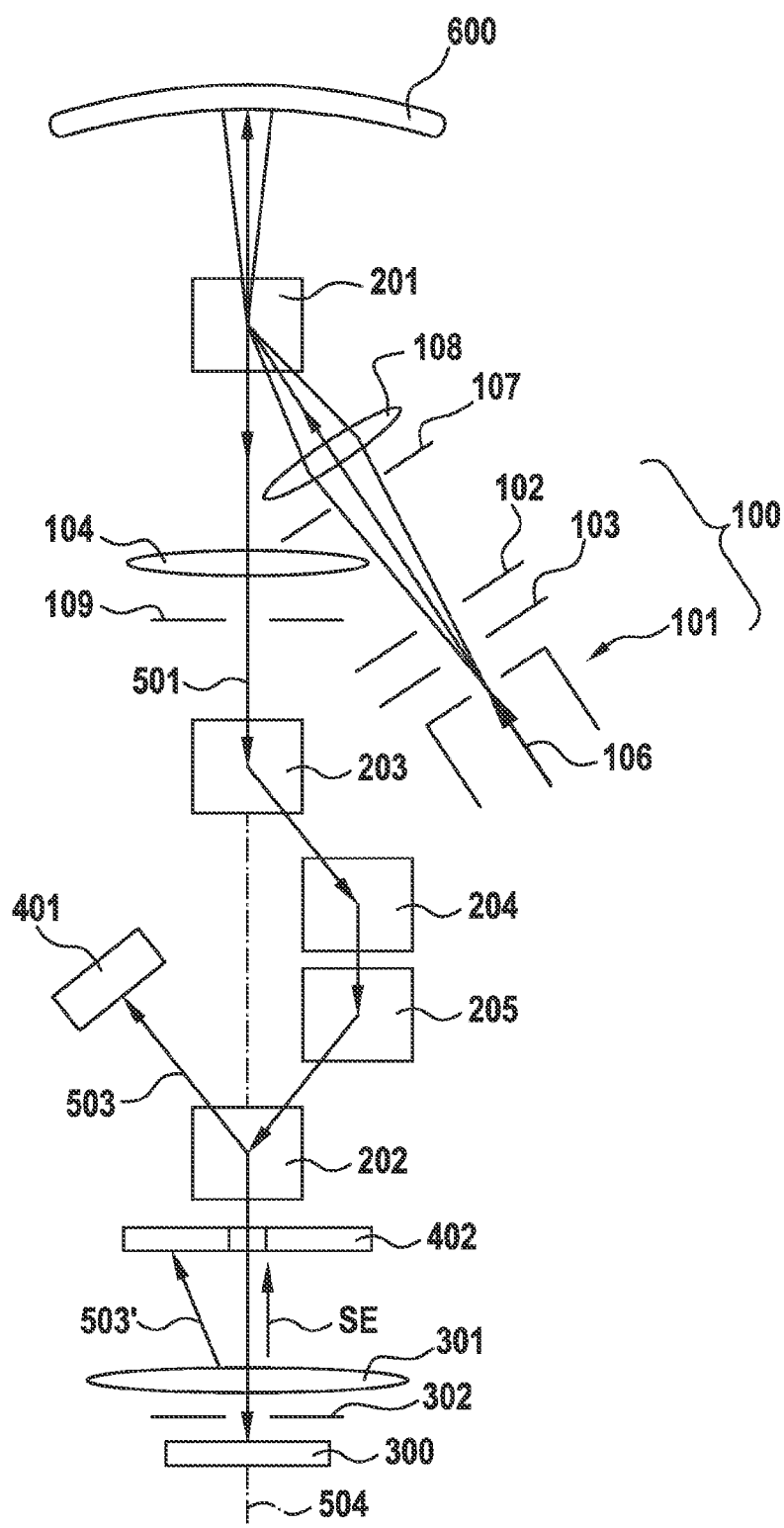

FIG. 3D is a schematic illustration of a charged particle beam device according to yet another embodiment. The setup of a charged particle beam device shown in FIG. 3D includes two detectors, i.e. a first charged particle beam detector 401 and a second charged particle beam detector 402. The first charged particle beam detector 401 corresponds to the detection device 400 described herein above with respect to FIGS. 1 and 2.

The second charged particle beam detector 402 is an approximately annular or segmented detection device which is adapted for detecting secondary charged particles of the secondary charged particle beam 503 between the objective lens and the second beam separator 202.

According to embodiments which can be combined with other embodiments described herein, the charged particle beam device illustrated in FIG. 3D includes three additional beam deflectors 203, 204, and 205 arranged in the charged particle beam propagation path and being adapted for further improvement of charged particle beam parameters, in particular for providing beam dispersion compensation, at least partially.

FIG. 4 is a flowchart illustrating a method of operating a charged particle beam source device. As shown in FIG. 4, after a start of the procedure (block 801), a primary charged particle beam 501 is generated by a primary beam source device 100, block 802. Then, at block 803, the procedure provides transmitting, via a first beam separator 201 the primary charged particle beam 501 to a mirror corrector device 600 and compensating spherical and/or chromatic aberrations introduced by optical components of the charged particle beam device by means of the mirror corrector device 600 such that a compensating primary charged particle beam 502 is provided.

Furthermore, at block 804 the primary charged particle beam 501 is separated from a compensating primary charged particle beam 502 received from the mirror corrector device 600 by means of the first beam separator 201, wherein the first beam separator has at least a magnetic deflector configured to generate at least one dipole magnetic field. According to embodiments which can be combined with other embodiments described herein, both the primary charged particle beam 501 and the compensating primary charged particle beam 502 are focused into the center of the first beam separator 201. In this way, the compensating primary charged particle beam 502 is separated from the source beam, i.e. from the primary charged particle beam 501, e.g. without introducing aberrations. In this way the compensating primary charged particle beam 502 which is separated from the primary charged particle beam 501 by means of the first beam separator 201, when leaving the first beam separator 201, is provided with a correction waveform which is adapted for providing compensation of spherical and/or chromatic aberrations, e.g. of optical components arranged in the complete optical configuration.

As used herein, the term "compensating primary charged particle beam" is sometimes referred to as a charged particle beam having "negative" aberrations with respect to aberrations introduced by optical components of the charged particle beam device and/or by optical components arranged in the charged particle beam propagation paths. According to an embodiment a virtual beam source can be represented by the image of the primary beam source device 100 in the center of the first beam separator 201. This virtual beam source with its emitting bundle can contain waveform information which can be used for aberration correction, at least partially. The waveform information can be represented by respective "negative" aberrations created by the corrector device.

According to embodiments which can be combined with other embodiments described herein, the correction waveform can be provided by including negative aberrations with respect to aberrations of optical components. Thereby, spherical and/or chromatic aberrations of optical components can be compensated, at least partially, by the correction waveform having the respective negative aberrations.

According to embodiments which can be combined with other embodiments described herein, dispersion compensation can be provided in the charged particle beam device. The dispersion compensation and/or beam alignment can be performed by means of at least one element having crossed electrostatic-magnetic deflection fields, as e.g. element 307 shown in FIG. 3C.

Then, at block 805, the compensating primary charged particle beam 502 is focused onto the specimen 300 to be inspected by means of the objective lens 301. A second beam separator 202 is provided for separating the secondary charged particle beam 503 originating from the specimen 300, from the compensating primary charged particle beam 502 (block 806). The secondary charged particle beam 503 originating from the specimen 300 is analyzed in a charged particle beam detector 401, 402 see e.g. FIG. 3D (block 807). The procedure is ended at a block 808.

Herein, charged particles of the primary charged particle beam 501 and/or of the compensating primary charged particle beam 502 propagating between the primary beam source device 100 and the objective lens 301 are provided with a high beam boost energy of at least 8 keV, typically at least 15 keV, and in particular with an energy of at least 30 keV. If an electron beam is generated in the primary beam source device 100, then the electron gun 101, and its anode 102 respectively, provide the high electron acceleration to an intermediate beam energy.

Furthermore, in the objective lens 301 and/or between the objective lens 301 and the specimen 300, the charged particles of the compensating primary charged particle beam 502 are decelerated to a landing energy which amounts to approximately 5 keV or below, and typically amounts to approximately 500 eV or below. The intermediate beam acceleration system can provide a primary charged particle beam 501, 502 with initially high particle beam energy. The charged particles will then be decelerated to a landing energy shortly before striking the specimen 300. The energy or beam voltage ratio $V_{acc}/V_{landing}$ between the acceleration voltage $V_{acc}$ at which the charged particles are guided through the column and the landing voltage $V_{landing}$ at which the charged particles strike the specimen 300 can be about at least 5 or higher, e.g. 10 or even higher, such as e.g. 10 to 100.

In addition to that, or alternatively, the control electrode 302 shown in FIGS. 1 and 3 can be used for decelerating the primary charged particle beam before the charged particle beam impinges with the landing energy of the charged particles on the specimen 300. Control electrode 302 may also be used to adjust the extraction field for the secondary particles release on the specimen surface. According to yet another modification or alternative thereof, the landing energy of primary electrons on the specimen can be defined by biasing the specimen 300. Thereby, the landing energy of the electron beam can be adjusted.

As compared to previous aberration correction assemblies, for example for correcting spherical and/or chromatic aberrations using either multipole correctors or mirror correctors, embodiments as described herein have a reduced complexity and can avoid complex adaption ray path including, for example, beam splitters, transfer lenses, etc., for effective operation thereof. Accordingly, a simple and robust SEM column architecture including a mirror corrector for spherical and/or chromatic aberration can be provided. Embodiments avoid highly sophisticated beam divider elements in combination with the transfer lenses, which have previously been considered. The robust solution enables an application in process diagnostic tools used in CD, DR or EBI applications. Sub-nanometer resolutions can be provided.

According embodiments, which can be combined with other embodiments described herein, the apparatus and methods can be configured for or can be applied for electron beam inspection systems, for critical dimension measurement applications and defect review applications. In particular, the charged particle beam device according to embodiments described herein can be used as a charged particle beam inspection device which can be designed e.g. for defect review applications, for testing integrated circuits, for critical dimension measurement analysis, for high speed scanning, etc. In particular, if electrons are used as the charged particles, the charged particle beam inspection device can be designed as an electron beam inspection (EBI) device.

In particular, a high brightness and low energy width electron source including of a thermal field emitter TFE, a cold field emitter CFE, or carbon nanotube can be provided. Moreover, a low aberration, short focal length objective lens 301 can be used, which can be designed as an electrostatic-magnetic compound lens having an axial or radial magnetic gap, or as an electrostatic retarding field lens, or the like. Furthermore, a high beam boost energy of charged particles (e.g. electrons) inside the column of approximately 8 keV or higher, such as 15 keV, 30 keV or higher can be achieved wherein a deceleration of the charged particle beam to low landing energies inside the objective lens or between the objective lens 301 and the specimen 300 can be provided.

While the foregoing is directed to embodiments of the disclosure, other and further embodiments of the disclosure can be devised without departing from the basic scope thereof, and the scope thereof is determined by the claims that follow.

The invention claimed is:

1. A charged particle beam device, comprising:
 a primary beam source device adapted for generating a primary charged particle beam;
 a mirror corrector device adapted for providing compensation of at least one of spherical or chromatic aberrations;
 a first beam separator adapted for transmitting the primary charged particle beam to the mirror corrector device and for separating the primary charged particle beam from a compensating primary charged particle beam reflected by the mirror corrector device, wherein the first beam separator has at least a magnetic deflector configured to generate at least one dipole magnetic field;
 a transfer lens adapted for focusing the primary charged particle beam emitted from the primary beam source device into a center of the first beam separator;
 an objective lens adapted for focusing the compensating primary charged particle beam onto a specimen, wherein the objective lens is a retarding field lens configured for decelerating the charged particles of the compensating primary charged particle beam to a landing energy of approximately 1 keV or less; and
 a second beam separator adapted for transmitting the compensating primary charged particle beam to the specimen and for separating the compensating primary charged particle beam from a secondary charged particle beam originating from the specimen, wherein the first beam separator and the second beam separator are dispersion free combined magnetic-electrostatic deflection units.

2. The charged particle beam device according to claim 1, further comprising at least one condenser lens arranged between the first beam separator and the second beam separator or between the source and the first beam separator.

3. The charged particle beam device according to claim 2, wherein the mirror corrector device is adapted for correcting at least one of spherical aberrations and chromatic aberrations of at least one of the objective lens and the at least one condenser lens.

4. The charged particle beam device according to claim 1, wherein the primary beam source device is a high brightness, low energy width beam source selected from the group consisting of a thermal field emitter TFE source, a cold field emitter CFE source, and a carbon nanotube.

5. The charged particle beam device according to claim 1, wherein the second beam separator is a deflection element having at least one magnetic dipole deflection field.

6. The charged particle beam device according to claim 1, wherein the primary beam source device, the transfer lens, the mirror corrector device and the first beam separator form an aberration-compensating beam source device.

7. The charged particle beam device according to claim 1, further comprising an exit aperture arranged in an optical path between the first beam separator and the second beam separator, the exit aperture being adapted for adjusting an opening angle of the compensating primary charged particle beam towards the second beam separator.

8. The charged particle beam device according to claim 1, further comprising a further aperture arranged in an optical path between the primary beam source device and the first beam separator, the further aperture being adapted for adjusting an opening angle of a the primary charged particle beam incident onto the first beam separator.

9. The charged particle beam device according to claim 1, wherein the mirror corrector device comprises 3 or more individual electrodes.

10. The charged particle beam device according to claim 1, wherein at least one of the transfer lens and a condenser lens are included in a lens system comprising at least two lenses.

11. A method of operating a charged particle beam device, the method comprising:
generating a primary charged particle beam with a primary beam source device;
focusing the primary charged particle beam into a center of a first beam separator;
providing compensation of at least one of spherical or chromatic aberrations introduced by optical components of the charged particle beam device by means of a mirror corrector device such that a compensating primary charged particle beam is provided;
separating the compensating primary charged particle beam from the primary charged particle beam by means of the first beam separator, wherein the first beam separator has at least a magnetic deflector configured to generate at least one dipole magnetic field;
focusing the compensating primary charged particle beam onto a specimen to be inspected by means of an objective lens, wherein the objective lens is a retarding field lens in which the charged particles of the compensating primary charged particle beam are decelerated to a landing energy of approximately 1 keV or less;
separating a secondary charged particle beam originating from the specimen from the compensating primary charged particle beam by means of a second beam separator, wherein the first beam separator and the second beam separator are dispersion free combined magnetic-electrostatic deflection units; and
analyzing the secondary charged particle beam originating from the specimen.

12. The method according to claim 11, wherein charged particles of at least one of the primary charged particle beam or of the compensating primary charged particle beam propagate between the primary beam source device and the objective lens are provided with a high beam boost energy of at least 8 keV.

13. The method according to claim 11, wherein the compensating primary charged particle beam is focused into a center of the first beam separator.

14. The method according to claim 11, wherein the compensating primary charged particle beam which is separated from the primary charged particle beam by means of the first beam separator comprises a correction waveform which is adapted for providing compensation of at least one of spherical aberrations and chromatic aberrations.

15. The method according to claim 14, wherein the correction waveform is provided with negative aberrations with respect to aberrations of optical components arranged in the optical system.

16. The method according to claim 11, wherein at least one of dispersion compensation or beam alignment is performed by crossed electrostatic-magnetic deflection fields.

* * * * *